(12) United States Patent
Rozenfeld (10) Patent No.: US 8,421,022 B2
(45) Date of Patent: Apr. 16, 2013

(54) METHOD AND APPARATUS FOR TISSUE EQUIVALENT SOLID STATE MICRODOSIMETRY

(75) Inventor: Anatoly Rozenfeld, Redfern (AU)

(73) Assignee: University of Wollongong, Wollongong (AU)

( * ) Notice: Subject to any disclaimer, the term of this patent is extended or adjusted under 35 U.S.C. 154(b) by 752 days.

(21) Appl. No.: 12/520,077

(22) PCT Filed: Dec. 19, 2007

(86) PCT No.: PCT/AU2007/001961
§ 371 (c)(1),
(2), (4) Date: Dec. 23, 2009

(87) PCT Pub. No.: WO2008/074074
PCT Pub. Date: Jun. 26, 2008

(65) Prior Publication Data
US 2010/0090118 A1 Apr. 15, 2010

(30) Foreign Application Priority Data

Dec. 19, 2006 (AU) ................................ 2006907071

(51) Int. Cl.
*G01T 1/02* (2006.01)
(52) U.S. Cl.
USPC .................... 250/370.07; 250/371; 250/475.2
(58) Field of Classification Search ............. 250/370.07, 250/371, 475.2
See application file for complete search history.

(56) References Cited

U.S. PATENT DOCUMENTS

| 5,430,308 A | 7/1995 | Feichtner et al. |
| 5,693,968 A * | 12/1997 | Cherry et al. ................. 257/231 |
| 5,818,322 A * | 10/1998 | Tasumi ........................... 338/15 |
| 2006/0027756 A1 | 2/2006 | Thomson et al. |

OTHER PUBLICATIONS

Rosenfeld et al., Neutron dosimetry with planar silicon p-i-n diodes, IEEE Transactions on Nuclear Science, Dec. 2003, 50(6)1, 2367-2372.*
Suryanarayanan et al., High-resolution imager for digital mammography: physical characterization of a prototype sensor, 2005 Phys. Med. Biol. 50 3957.*
Bradley, P.D. et al., "Performance of Silicon Microdosimetry Detectors in Boron Neutron Capture Therapy," *Radiation Research*, 1999, vol. 151, pp. 235-243.
Bradley, P.D. et al., "Solid state microdosimetry," *Nuclear Instruments and Methods in Physics Research B: Beam Interactions with Materials & Atoms*, 2001, vol. 184, pp. 135-157.
International Search Report mailed on Mar. 11, 2008, for International Application No. PCT/AU2007/001961 filed on Dec. 19, 2007, 4 pages.
Pickel, J.C. et al., "Radiation Induced Transient Effects in HgCdTe IR Focal Plane Arrays," *Proceedings of SPIE, Optical, Infrared, and Millimeter Space Telescopes*, Oct. 2004, vol. 5487, pp. 698-709.

* cited by examiner

*Primary Examiner* — David Porta
*Assistant Examiner* — Djura Malevic
(74) *Attorney, Agent, or Firm* — Kilpatrick Townsend & Stockton LLP (57) ABSTRACT

A microdosimeter, comprising an array of three-dimensional p-n junction semiconductor detectors, each providing a sensitive volume-target and a tissue equivalent medium for generating secondary charged particles. The array is manufactured from a semiconductor on insulator wafer and the detectors are located to detect secondary charged particles generated in the tissue equivalent medium.

17 Claims, 9 Drawing Sheets

METHOD AND APPARATUS FOR TISSUE EQUIVALENT SOLID STATE MICRODOSIMETRY

RELATED APPLICATION

This application is based on and claims the benefit of the filing date of AU application no. 2006907071 filed 19 Dec. 2006, the content of which is incorporated herein by reference in its entirety.

FIELD OF THE INVENTION

The invention relates to a method and apparatus for tissue equivalent solid state microdosimetry, of particular but by no means exclusive application in predicting the probability of cell damage in a radiation field and for predicting Single Event Upsets (SEUs) in microelectronics and dose equivalent measurement.

BACKGROUND OF THE INVENTION

Classical radiation absorbed dosimetry operates to determine the average energy deposited per unit mass, J/kg, but cannot predict the radiobiological effects in biological tissue for all types of radiation.

Early attempts at understanding cellular radiation effects recognized that knowledge of the energy distribution at a scale comparable to the structures affected by irradiation ("ending point") was essential, and hence on a cellular level or DNA level. Consequently, the study of radiation effects on living cells is termed microdosimetry.

One of the factors affecting local energy deposition is Linear Energy Transfer (LET), that is, the loss of energy per unit distance along the path of a charged particle. With smaller targets, deterministic energy deposition becomes stochastic and depends on the target size and spatial pattern of energy deposited by radiation (by charged particles). It limits the correlation of the LET approach with radiobiological effects.

There are several reasons for the limitations in the LET concept. Firstly, delta ray energy distribution and its relationship to spatial dose distribution are not adequately considered. Particles with different velocities and charges can have the same LET but it is the particle velocity that largely determines the energy distribution of delta rays. In microscopic volumes, the delta ray distribution may be a significant factor in the spatial distribution of energy, particularly at higher ion energies and small site sizes.

Finally, LET, being a non-stochastic average quantity, does not account for the random fluctuations in energy deposition which manifest as clustering of energy deposition and range straggling. The variance due to straggling may exceed the path length variations at high ion energies and small site sizes.

These limitations in LET lead to the formulation of a set of measurable stochastic quantities that provide the fundamental basis for the field of microdosimetry. The two principal quantities are specific energy z=ϵ/m (where ϵ is energy deposited in a volume by a single energy deposition event and m is a mass of the sensitive volume-target SV) and lineal energy y, which is defined as the ratio of ϵ to $\bar{l}$, the mean chord length in that volume. Hence:

$$y = \frac{\varepsilon}{\bar{l}} \qquad (1)$$

Lineal energy is commonly presented in units of key $\mu m^{-1}$. The mean chord length in a volume is the mean length of randomly orientated chords in that volume, that is $$\bar{l} = \frac{4V}{S} \qquad (2)$$

where V is the volume of the microscopic sensitive volume-target (SV) and S is the surface area of the SV. The SV must clearly be well defined.

It is the goal of experimental microdosimetry to measure these quantities in well-defined microscopic volumes, and is hence referred to as regional microdosimetry. Regional microdosimetry is concerned with the measurement of energy deposition in sites and it is the principal objective of experimental microdosimetry. There is a link between microdosimetric experimental quantities and the observed effects of radiation on biological cells.

The probability distribution of lineal energy f(y) or as a dose distribution d(y) (fraction of energy versus event size) are fundamental functions in regional microdosimetry. The relationship between f(y) and d(y) is:

$$d(y) = \frac{yf(y)}{\bar{y}_F} \qquad (3)$$

where $\bar{y}_F$ is the average lineal energy for a particular radiation field and secondary charged particle in a medium of interest, and:

$$\bar{y}_F = \int_0^\infty yf(y)dy \qquad (4)$$

The dose distribution relationship reflects the fact that higher lineal energies deposit a higher dose.

From the single event lineal energy distribution and the site geometry one may calculate all microdosimetric distributions of interest using the formulae presented above. The representation of these fundamental microdosimetric spectra is traditionally displayed as a log-linear plot with the ordinate multiplied by y, such that the area under the curve delimited by two values of y is proportional to the fraction of events (for f(y)) or the fraction of dose(for d(y)) delivered by events in this range of lineal energy values. This representation accommodates the wide lineal energy range often observed in microdosimetric spectra (from 0.01 keV/µm to several hundred keV/µm) but requires further scaling to preserve the dose to area correspondence.

Microdosimetry requires instrumentation for measurements of energy δ deposited in a cellular (or sub cellular) SV of interest (whether tissue or water), event-by-event from secondary particles generated in the medium of interest by the radiation field. Of use in such measurements was the development in the early 1950s of the low-pressure gas proportional counter, also referred to as the Rossi counter. Adjustment of sensitive volume up to 1 micron is possible by changing of the gas pressure in a counter. Tissue-Equivalent Proportional Counters (TEPCs) of this type (which are tissue equivalent owing to the tissue equivalence of the gas and surrounding walls) have several shortcomings:

1. TEPCs require a gas supply system that are inconvenient in many applications;
2. TEPCs are large, up to 1 to 2 cm in diameter, which limits their use where spatial resolution is required;
3. TEPCs require high voltage biases; up to 2 kV; and 4. TEPCs suffer from the "wall effect" and other physical size related effects, being much larger than the cell structures, leading to artefacts in microdosimetric spectra.

Microdosimetric spectra can be converted to radiobiological characteristics of the radiation field by convolution with a quality coefficient Q over the range of lineal energies, which reflects increasing probability of cell inactivation with increasing lineal event energy. The coefficient Q is determined by the ICRU (the International Commission on Radiation Units and Measurements) and based on experimental in vitro cell survival measurements; its analytical values are tabulated in Table 1 as a function of L, the unrestricted linear energy transfer in water.

TABLE 1

Quality coefficient Q (L)

| L (keV µm$^{-1}$) | Q (L) |
|---|---|
| <10 | 1 |
| 10-100 | 0.32L-2.2 |
| >100 | 300/L$^{0.5}$ |

Q is thus a measure of the main difference between absorbed dosimetry and equivalent (radiobiological) dosimetry of radiation fields.

Solid state detectors are very good owing to their small SV size; this is why in some situations minidosimetry is used instead of microdosimetry. In minidosimetry the small SV of the detector is used to measure absorbed dose or dose rate but with high spatial resolution. For example, MOSFET detectors (which have a very small SV of micron or submicron size) are able to measure absorbed doses with 1 micron spatial resolution, but cannot distinguish the energy deposited in the SV due to a particular event. The output signal instead represents the integral of many events depositing energy in the SV. This occurs with many solid state detectors, such as dosimetric diodes working in current mode, TLDs (thermoluminescent dosimeters) and film.

However, passive solid state detectors can be used to some extend in microdosimetry. For example, glow peaks in some TLDs are sensitive to LET of particles that are associated with energy deposition on the micron and submicron level. These detectors are not a suitable substitution for TEPCs, as do not have proper LET resolution and cannot be used in real time dosimetry.

Another passive microdosimetry detector device—disclosed in U.S. Pat. No. 5,596,199—records the energy deposition of incident radiation using an array of microstructure non-volatile memory devices. The charge from incident charge particles is stored in an electrically insulated (floating) gate, micron or submicron scale SV, of a FAMOS transistor. When this charge exceeds the threshold level the state of the memory cell changes, so the number of cells that have changed state is equal to the number of events that have deposited energy above the threshold. A predetermined initial charge is stored in each cell, which makes the charge increment required to change the state of the cells variable. This is claimed to provide a spectroscopy of the deposited energies, but it is a discreet spectroscopy rather than analogue or real spectroscopy. There can be uncertainty in the change of state of a memory cell, as—rather than resulting from a single event in the SV—a change of state can be due to several consecutive events, thereby giving an incorrect indication of the radiation field. Owing to the passive mode of operation, the charge deposited in the SV is therefore less than on a floating gate. The charge deficit due to recombination depends on the LET of the particle.

Recombination of charge in the gate oxide is well known in MOSFET detectors, and reduces the utility of MOSFET detectors for dosimetry in proton and heavy ions fields (even in an active mode). This microdosimeter is designed principally to distinguish the gamma and neutron components of a radiation field, but it can only with difficulty obtain dose equivalent using the weighting coefficient Q in arbitrary radiation fields as recommended by the ICRU.

Another approach, based on the parallel connection of micron scale Si detectors (p-n junctions), provides an active array of micron scale SVs. In this approach reverse biased Si detectors with micron scale silicon SVs—comparable in size to biological cells—are connected to a nuclear spectroscopy setup. The small area of the array of p-n junctions allows pile up to be avoided, provided that charge is generated in a single SV only (which is true in most situations). This condition does not hold, however, if the charged particle traverses an SV in a direction substantially parallel to the surface of the chip. In such cases energy can be deposited in two cells simultaneously, providing a greater charge than if it were deposited in a single SV. Spectroscopy information can be converted to dose equivalent using a weighting factor recommended by the ICRU. This technique has been demonstrated using planar arrays of p-n junctions of NMOS and CMOS SRAM with an SV size of 44×44×3 microns. Applications of such planar arrays of p-n junctions for regional microdosimetry are limited owing to uncertainty in the average chord, charge collection efficiency within the SV, overlayers and shape of the SV. Increasing the total area of the p-n junction array leads to increases in the noise owing to an increase in capacitance that reduces the minimal LET detected by the microdosimeter. A segmentation approach with several parallel readout spectroscopy channels has been suggested to reduce the noise of the microdosimeter; this method has been demonstrated in the separation of gamma-neutron field without any qualitative or quantitative (dose equivalent) characterization of the radiation field.

Charge collection spectroscopy in a micron size array of planar P-N junctions (SVs) of a memory chip (SRAM) strongly depends on the fabrication technology, the angle of incidence and SV shape. Hence, interpretation of MCA spectra for conversion to dose equivalent is complex.

Figure 1:
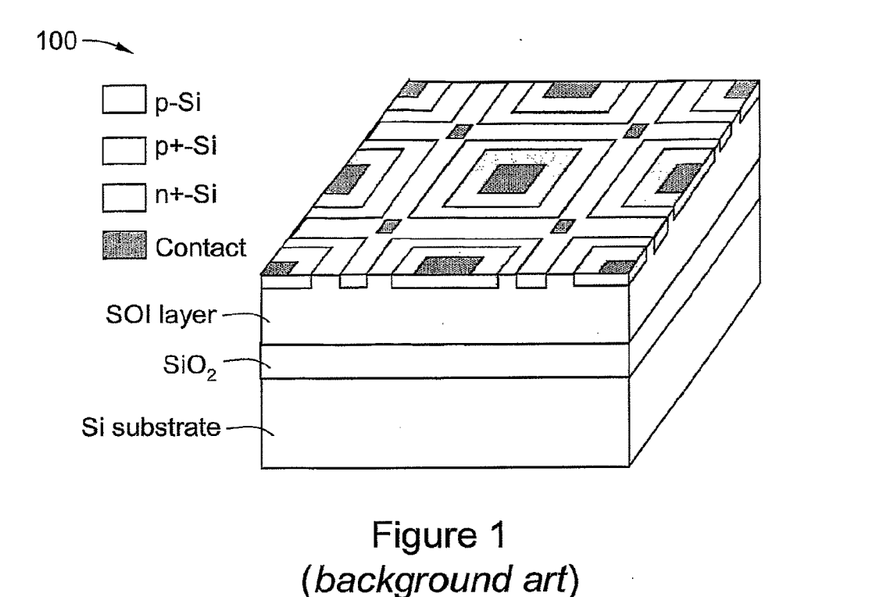
FIG. 1 is a view of a solid state microdosimeter with an array of parallel planar p-n junctions manufactured on Silicon-on-Insulator according to the background art.

A solid state silicon microdosimeter based on a parallel array of p-n junctions for measurements of tissue equivalent microdosimetric spectra has also been investigated. The viability of measuring integral dose and microdosimetric spectra simultaneously at the same point in a water phantom in fast neutron therapy beam has been demonstrated. A new generation solid state microdosimeter with an array of parallel p-n junctions manufactured on SOI (Silicon-on-Insulator) with SV thicknesses of 2, 5 and 10 µm have been produced and investigated. RPP (right angle parallelepiped) shaped 30×30 µm planar SVs (outer P+ contact) and 10×10 µm care (N+P p-n junction) regions were connected in parallel producing arrays of 4800 and 10000 cells. FIG. 1 is a schematic view of such an SV at 100, comprising a 3D-fragment of an SOI p-n junction array. The SOI p-n junction array has a better defined SV than have arrays of p-n junctions on a bulk material or commercial SRAM.

Figure 2:
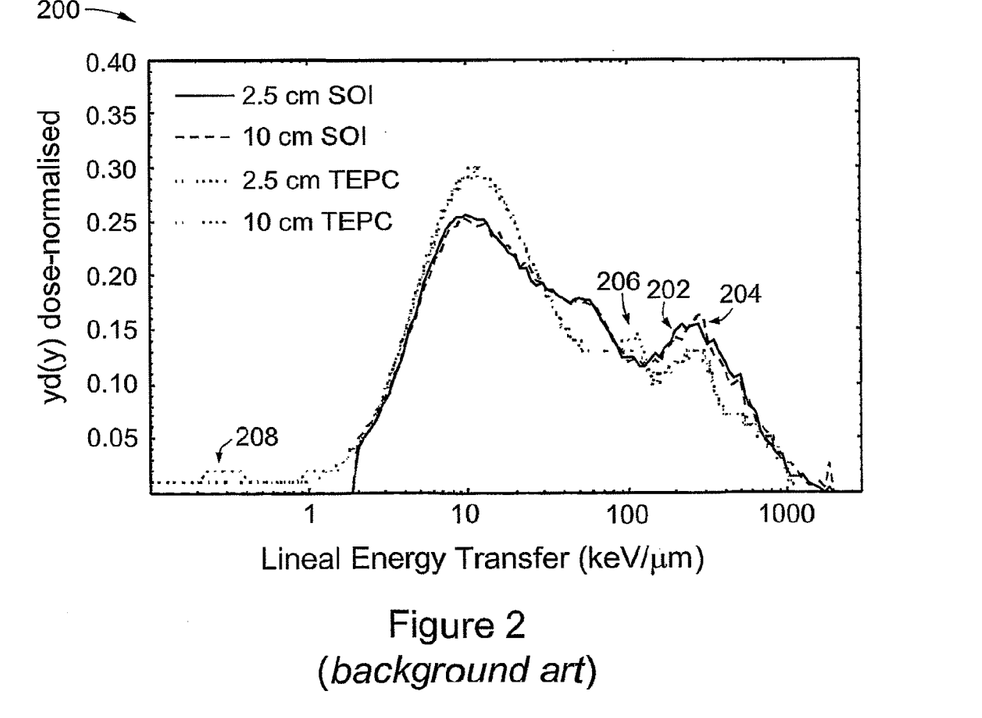
FIG. 2 is a plot of microdosimetric spectra obtained with gas TEPC and 10 µm SOI 4800 parallel cell microdosimeters according to the background art.

It has been demonstrated by Monte Carlo simulations that, for most charged particle of interest ($\alpha$-particles, protons, electrons and some heavy ions typical for radiation therapy), a 3×3×3 µm silicon SV is equivalent to 5×5×5 µm of soft tissue. This amounts to a conversion linear scaling coefficient $\zeta=0.63$. It has also been demonstrated that solid sate microdosimetry spectra can be converted to tissue equivalent (TE) microdosimetry spectra, that is, to dose equivalent. FIG. 2 is a plot 200 of microdosimetric spectra obtained with gas TEPC and 10 μm SOI 4800 parallel cell microdosimeter using developed conversion, at depths of 2.5 and 10 cm in a water phantom on an FNT (Fast Neutron Therapy) beam after TE conversion. These spectra were obtained in a water phantom at the FNT facility, Harper Hospital, Detroit, USA. (The tissue equivalent microdosimetric spectrum obtained with an SOI microdosimeter at depth 2.5 cm in water is shown at 202 and at depth 10 cm in water at 204; the tissue equivalent microdosimetric spectrum obtained by TEPC at depth 2.5 cm in water is shown at 206 and at depth 10 am in water at 208.)

It is apparent from FIG. 2 that an SOI microdosimeter with an array of planar p-n junctions is essentially unable to measure events with LET (Lineal Energy Transfer) less than 1-2 keV/μm; this is due to detector noise. This low LET part of the spectra is related to high energy gamma radiation, but it can dominate in certain radiation fields and is important to measure.

Figure 3A:
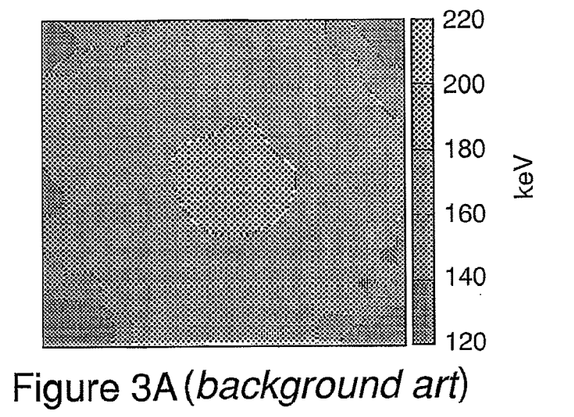
FIGS. 3A, 3B and 3C are charge collection images, obtained with 3 MeV α-particle scanning microbeam in 30×30 µm planar RPP SVs in a 10 µm SOI microdosimeter of the background art.
Figure 3B:
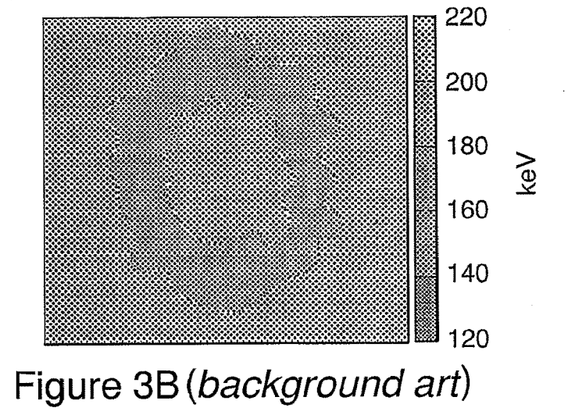
Figure 3C:
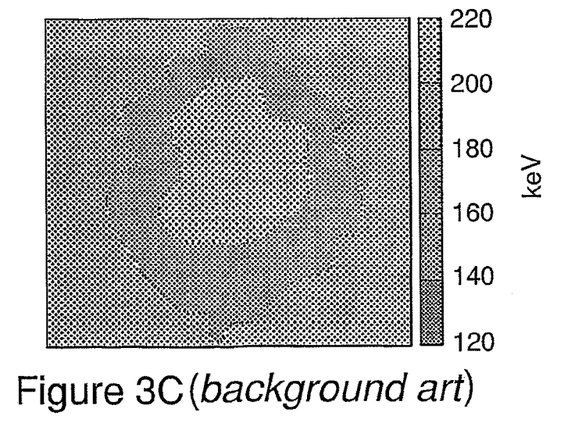

Detailed investigations of charge collection in a single SV of an SOI planar RPP SVs using IBIC ion microbeam has shown non-uniformity of charge collection, with increasing charge deficit laterally away from the centre of SV. FIGS. 3A, 3B and 3C are charge collection images, obtained with 3 MeV α-particle scanning microbeam in 30×30 μm planar RPP SVs in a 10 μm SOI microdosimeter. FIG. 3A corresponds to a p-n junction bias of 0 V, FIG. 3B to a p-n junction bias of 5 V and FIG. 3C to a p-n junction bias of 10 V. Charge collection is almost 100% in the central part of the SV under the $N^+P$ p-n junction and diminishes laterally from the central axis of the SV owing to the lessening electrical field.

Losses of charge in a planar P-N junction cell due to recombination prevents the accurate measurement of energy deposited in a cell from a single event, thus reducing the accuracy of equivalent dosimetry. This is a disadvantage of the current design of solid state microdosimeters with planar p-n junction. Also, reducing the size of the SV to reduce the charge deficit reduces the energy deposited in the SV, and this technique is also limited by the noise of the detector.

Two charged particles with the same LET can have different delta electron track structures, which are dependent on the speed of the charged particle. As the size of the SV is reduced, high energy delta electrons can be deposited in neighbouring cells (viz. SVs) and will be accepted as single events in an SV owing to the parallel connection of the p-n junctions. This produces an error in the determination of the cluster of deposited energy in a single SV. This effect is typical for high energy heavy ions in deep space radiation with delta electron energies up to 1 MeV.

SUMMARY OF THE INVENTION

According to a first broad aspect, therefore, the present invention provides a microdosimeter, comprising:
 an array of three-dimensional (i.e. not planar) p-n junction semiconductor detectors, each providing a sensitive volume-target; and
 a tissue equivalent medium for generating secondary charged particles;
 wherein the array is manufactured from a semiconductor on insulator wafer and the detectors are located to detect secondary charged particles generated in the tissue equivalent medium.

The semiconductor detectors are typically—and most practically—silicon detectors, but they can be of other types such as GaAs, CdTe and organic semiconductors.

The detectors may be at least partially embedded in the tissue equivalent medium.

In one particular embodiment, the detectors are micron scale detectors.

However, in other embodiments it is possible to provide submicron scale detectors (i.e. "nano-dosimetry"), with little noise from readout electronics.

In one embodiment, the detectors are cylindrical or near-cylindrical, or frusta-conical.

However, the detectors may be produced in other shapes, such as cubes or rectangular prisms.

In one particular embodiment, each detector has a core p+ electrode and an outer n+ electrode region. Preferably the core comprises a rod-like p+ region within a Si SV. Hence, a strong electrical field can be achieved with a low bias voltage (of, for example, 10-15 V).

In one particular embodiment, the tissue equivalent medium comprises polymethylmethacrylate (which is also known as acrylic).

One advantage of this microdosimeter is its essentially 100% collection of charges produced by charged particles owing to the absence of lateral diffusion (which occurs with planar p-n junctions in existing arrangements). It allows accurate determinations of deposited energy event by event, and allows error reductions in the determination of dose equivalents.

In an embodiment, each of the detectors is an avalanche detector for amplification of the deposited charge. Preferably the amplification is controllable with p-n junction bias.

In one particular embodiment, the detectors are connected such that each of the detectors is not connected to at least one of its immediately neighbouring detectors of the detectors. This allows the more accurate observation of the pattern of charge particle track produced by δ-electrons and the use of more sophisticated approaches in the determination of dose equivalent.

According to another aspect of the invention, there is provided a method for performing microdosimetry, employing the microdosimeter described above.

Thus, the present invention provides a method for performing microdosimetry, comprising:
 exposing a tissue equivalent medium to a radiation source, thereby generating secondary charged particles in the tissue equivalent medium; and
 detecting at least some of the secondary charged particles with an array of three-dimensional p-n junction semiconductor detectors, each providing a sensitive volume-target, the array manufactured from a semiconductor on insulator wafer.

According to yet another aspect of the invention, there is provided a method for processing data generated with the microdosimeter described above, to convert spectra of charge deposited in .Si to tissue dose equivalent, comprising:
 acquiring at least one spectrum with a microdosimeter as described above;
 determining absorbed dose in Si from the spectrum;
 converting the spectrum to a lineal energy spectrum;
 determining from the lineal energy spectrum a differential dose d(y) deposited in tissue equivalent material by secondary events within a lineal energy range y to y+dy;
 converting semiconductor (e.g. silicon) absorbed dose to tissue equivalent absorbed dose using respective semiconductor and tissue equivalent ionizing stopping powers for secondary particles; and
 determining dose equivalent in a tissue from the tissue equivalent absorbed dose, including convoluting the differential dose (typically normalized) with a lineal energy dependent quality coefficient.

The converting of the spectrum to a lineal energy spectrum typically employs a tissue equivalent average chord (such as determined from an average SV chord).

The lineal energy dependent quality coefficient is typically Q(y).

According to another aspect of the invention, there is provided an array of p-n junction semiconductor (e.g. silicon) detectors for microdosimetry, each providing a sensitive volume-target, wherein the detectors are arranged in groups each with a common output, and each of the detectors has one or more immediate neighbours of the detectors from a different group.

This allows coincidence measurements to be made based on an event in a particular detector occurring in coincidence with an event or events in its neighbours.

In one embodiment, the detectors are arranged at the interstices of a regular two dimensional grid, such that each of detectors has four immediate neighbours unless located at an edge or corner of the array. In this embodiment the array comprises a plurality of rows of detectors, each of which may comprise two of the groups of the detectors interleaved with respect to each other.

According to still another aspect of the invention there is provided a method of observing delta electrons or the track structure of delta electrons, comprising:
measuring a first charge deposited in a first SV by charged particles in coincidence with a second charge or charges deposited in one or more further SVs neighbouring the first SV.

The method may include determining a track structure of the charged particles from the first charge and the second charge or charges, such as by determining a pattern with which the first charge and the second charge or charges are deposited, by comparing the first charge with the second charge or charges, or by determining a ratio of the first charge and the second charge or charges.

This information can be used in predicting radiobiological effects and to correct dose equivalent in a tissue.

BRIEF DESCRIPTION OF THE DRAWING

In order that the invention may be more clearly ascertained, embodiments will now be described, by way of example, with reference to the accompanying drawing, in which.

DETAILED DESCRIPTION OF THE INVENTION

Figure 4:
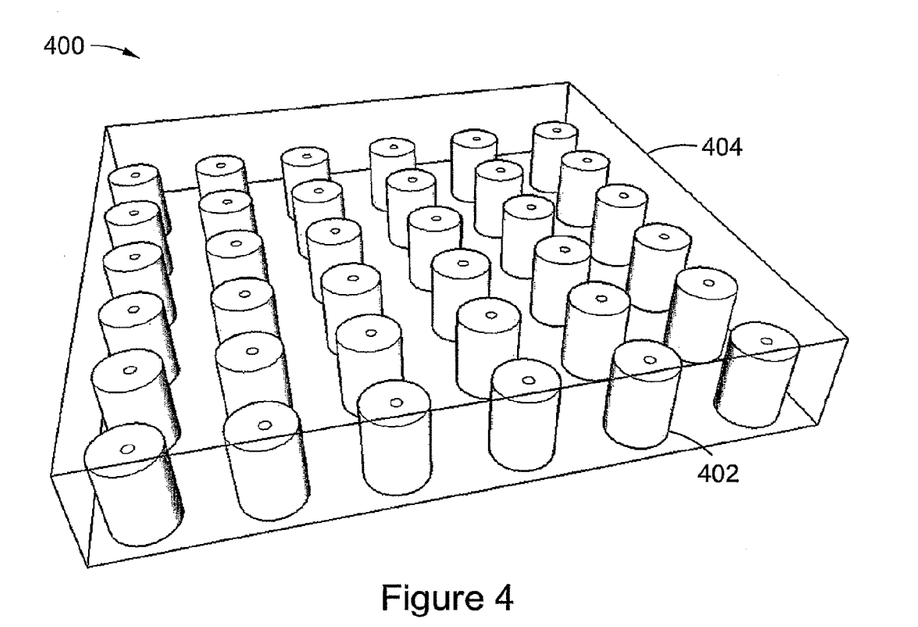
FIG. 4 is a simplified schematic view of a solid state microdosimeter comprising a micron or submicron array of cylindrical or near-cylindrical three-dimensional SVs according to an embodiment of the present invention.

FIG. 4 is a schematic isometric view (though simplified, including by the omission of electrical connections) of a solid state microdosimeter 400 according to an embodiment S of the present invention. The microdosimeter 400 comprises a micron or submicron array of cylindrical or near-cylindrical three-dimensional—and hence non-planar—SVs (each a silicon detector) 402. The illustrated example comprises a 6×6 array, but this is purely for illustrative purposes; in practice the microdosimeter may comprise an array of 4800 or more SVs, and it will be understood that arrays of other sizes may be employed according to this embodiment; the arrays are commonly square but need not be.

The array of 3D SVs is manufactured from an SOI wafer, such as with isolation technology (e.g. mesa etching technology). The 3D SVs—once manufactured—are embedded in PMMA (or acrylic) 404 by any known, suitable technique. The PMMA 404 is a tissue equivalent medium for the generation of secondary charged particles, as in tissue in the case of neutron irradiation and also for electronic equilibrium in the case of photon radiation. The thickness of the PMMA 404 can be selected according to application, as will be appreciated by those skilled in this art. The microdosimeter 400 has internal (avalanche) amplification. In use microdosimeter 400 is covered with the tissue equivalent material of interest or inserted into an object of interest for measurements of dose equivalent produced by secondary particle in the material of interest.

Figure 5:
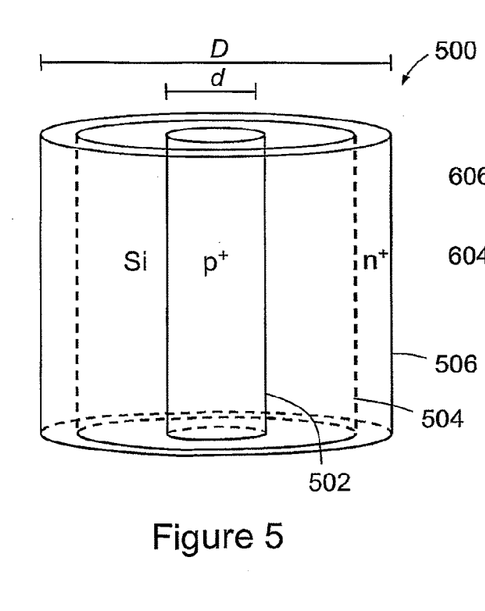
FIG. 5 is a schematic view of an ideal form of an SV of the microdosimeter of FIG. 4.

FIG. 5 is a schematic view of an ideal form 500 of an SV 402 of microdosimeter 400. In their ideal form 500 the SVs 402 are cylindrical (as depicted in this figure), but manufacturing constraints will make most practical SVs according to this embodiment near-cylindrical frusta-conical. The SVs 402 are produced using SOI technology. Each comprises a core p+ inner diffusion or implantation layer 502 (of diameter d), surrounded by at active silicon layer 504, and a n' outer layer 506 (of outer diameter D). The fixed thickness active silicon layer 504 of the SOI and of the surface of each SV allows SVs of well defined and uniform shape to be manufactured. Three possible sizes of the SVs 402 are proposed: d=1 μm and D=5 μm, d=3 μm and D=8 μm, and d=5 μm and D=10 μm.

The p+ core 502 and n+ outer layer 506 produce a well defined electrical field allowing substantially 100% charge collection. The small radial size of the p+ core 502 (and SV 402 overall) provides a sufficiently strong electrical field near the core 502 with reasonable values of applied reverse bias (for example, 5-10 V) or the avalanche process. Such structures were produced by 0.18 μM technology. Spatial separation of the SVs is achieved with, for example, mesa-etching technology on a depth of active layer SOI.

As will be understood by those skilled in the art, in another embodiment SV 402 could instead have a n+ core and p+ outer layer.

Figure 6:
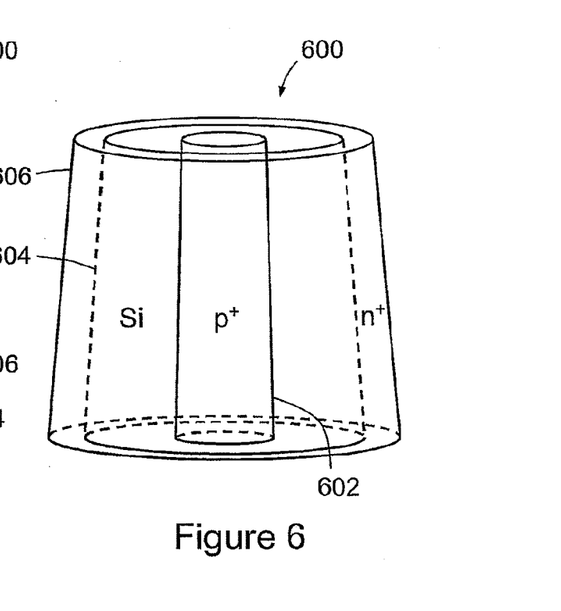
FIG. 6 is a schematic view of a near-cylindrical SV according to this embodiment.

FIG. 6 is a schematic view of a near-cylindrical and hence more realistic SV 600 suitable for microdosimeter 400. By 600 is also produced using SOI technology, and comprises a core p+ inner diffusion or implantation layer 502, surrounded by an active silicon layer 604, and a n$^+$ outer layer 606.

Figure 7:
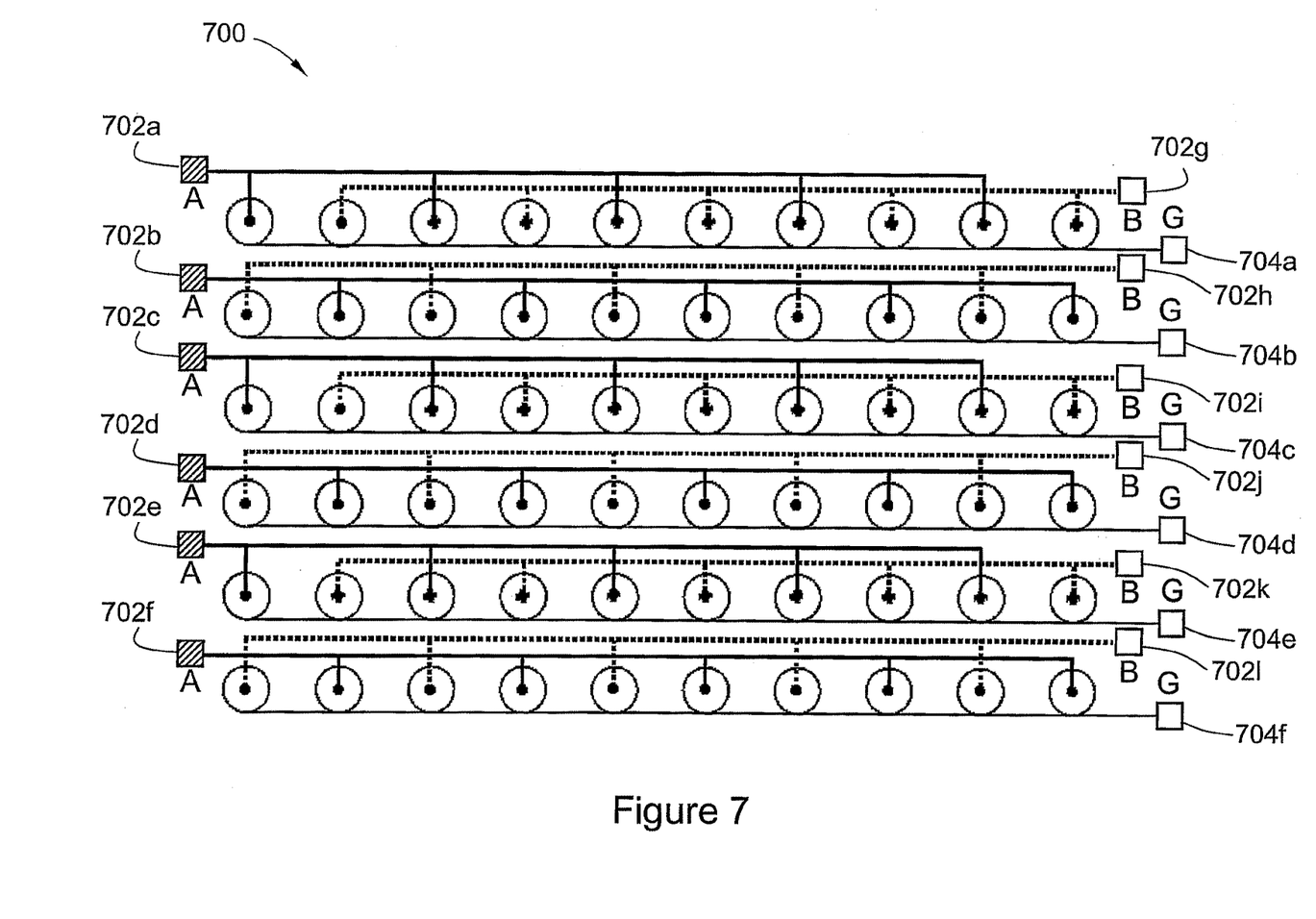
FIG. 7 is a simplified partial schematic view of the array layout of the SVs of the microdosimeter of FIG. 4.

FIG. 7 is a schematic view of the array layout 700 of SVs 402, 600 (comprising 3D p-n junctions) of microdosimeter 400. Array layout 700 comprises a number of groups of SVs connected to separate channels of the readout electronics (not shown), the readout electronics operating in spectroscopy mode. In this figure, the outer layer of each p-n junction is shown as a circle, and the inner core as a central dot.

In this example, each group of SVs comprises five SVs arranged generally horizontally (as shown in this figure) and interleaved with another group of SVs. Consequently, the (partial) array layout 700 includes 12 output pads 702a, 702b, 702c, 702d, 702e, 702f, 702g, 702h, 702i, 702j, 702k, 702l, each coupled to a separate channel of the readout electronics. The SVs are connected with thin aluminium traces; the cores of each group are connected together, while the outer layers of all the SVs in the array are connected together. Thus, in the uppermost row (in this view), the cores of the odd SVs (counting from the left in this view) are connected to output pad A 702a, and the cores of the even SVs to output pad B 702g. In the next row down, this is reversed: the cores of the odd. SVs (counting from the left) are connected output pad B 702h, and the cores of the even SVs to output pad A 702b.

All outer layers of the p-n junctions are connected to a pad G (or ground) 704a, 704b, 704c, 704d, 704e, 704f.

This arrangement allows measurements of energy cluster spread over more than one cell independently (where, in existing designs, such events will be related to a single p-n junction SV, thereby introducing errors in energy cluster determination). For example, such events may be in the form of high energy heavy ions with delta electrons radially distributed beyond the size of an SV. With layout 700, each SV is generally surrounded by four other SVs with different outputs from that of the first SV. Thus, in the figure, each SV with an electrical output pad B (clear) is surrounded by four SVs with output pads A (shaded). (SVs at the edge of the array have three neighbouring SVs, and corner SVs have two neighbouring SVs.) This segmentation allows pile-up effects to be reduced, and reduces the capacitance of each subset of the array, hence improving the energy resolution of the microdosimeter.

Also, independent readouts of output pads A and output pads B allow coincidence measurements, which are important for observing track structures. The radial distribution of a deposited energy event can be measured while the efficient sensitive total area of the microdosimeter is the same as in the case of a parallel p-n junction array. The ratio of the deposited energies in a the first SV and the surrounding four SVs, measured in coincidence, provides important radiobiological information in measurements of the RBE of a radiation field, in additional to the usual microdosimetry information.

Figure 8:
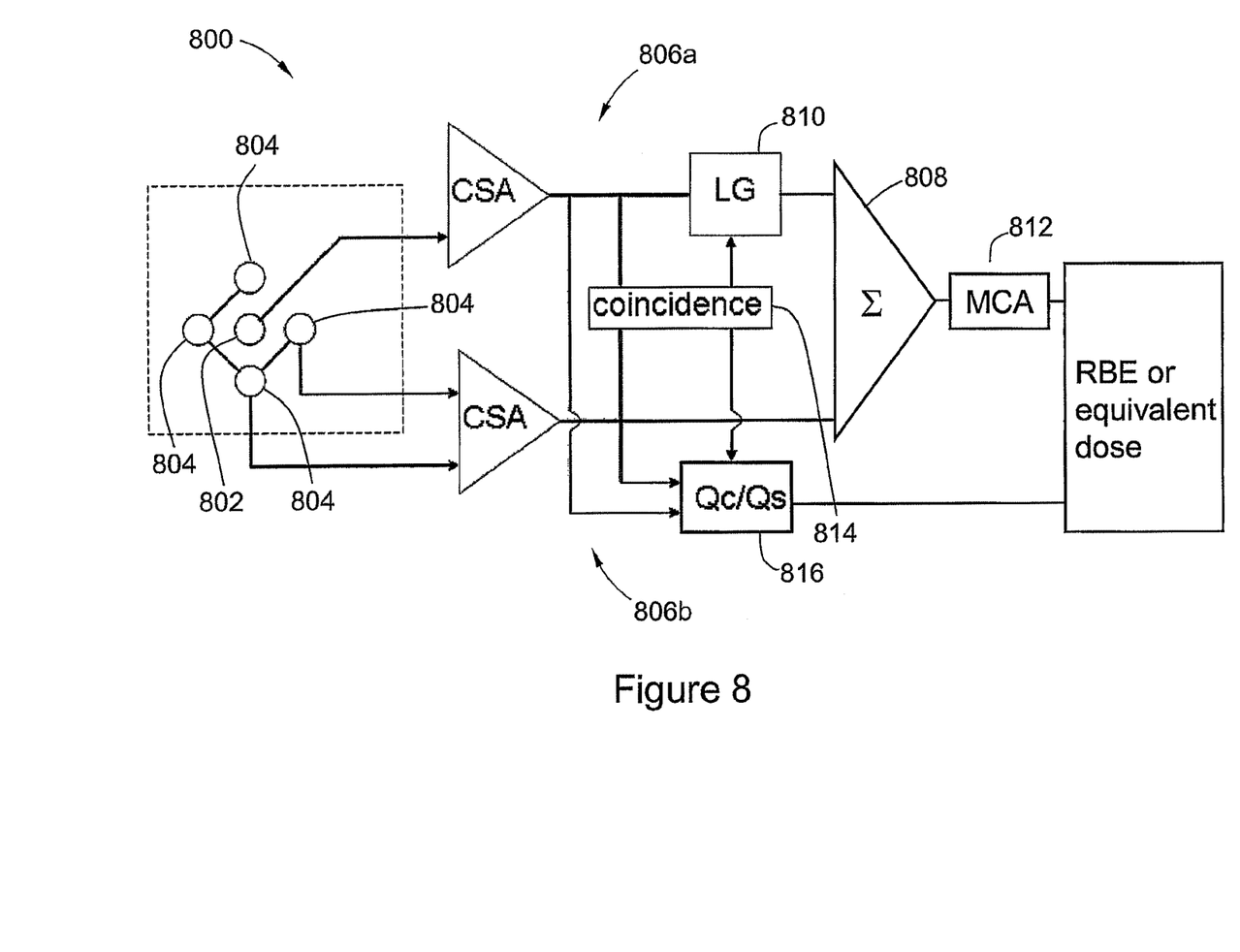
FIG. 8 is a readout schematic of a portion of the array layout of FIG. 7.

FIG. 8 is a readout schematic of a portion of the array layout 700 of FIG. 7. Exemplary "core" SV 802 and four "surrounding" SVs 804 are shown, connected to two separate readout charge spectroscopy channels 806a, 806b respectively, whose outputs are summed 808.

In practice there are many channels (or segments) of readout to reduce capacitance, each segment corresponding to a plurality of parallel rows of the array (cf. FIG. 7). This is achieved by connecting pluralities of output pads A, B and G (respectively).

Before summing, the first channel 806a (hence the output of the core SV 802) is passed through a linear gate 810, providing conventional MCA spectra (of energy deposited-in the SVs by secondary charged particles in the medium of interest) at MCA 812. For events with an energy deposition cluster distributed over the core SV 802 and surrounding SVs 804, a coincidence signal is generated 814 that blocks the second channel 806b (i.e. the outputs of the surrounding SVs 804) and charge is acquired to the MCA 812 from the core or first channel 806a. Separate values of "core charge" Qc from the core SV 802 and "surrounding charge" Qs from the surrounding SVs 804 are thus generated at 816, the former excluding spurious duplicate events from the surrounding SVs 804. Together, Qc and Qs provide 2D plots of energy distribution between the two channels, that is, the track structure of high energy events, without reducing the sensitive area of the microdosimeter 400. The spectrum of Qc/Qs ratio is a radiobiological parameter that extends the utility of the microdosimeter, including in the prediction of the cellular response to radiation fields in terms of track structure theory. Significant levels of coincidence events are expected in, for example, deep space radiation fields with high energy ions (such as Fe, Ti and C) with energies of the order of 1 GeV/u.

The solid state microdosimeter 400 and associated, front-end electronics 800 in both channels 806a, 806b are provided in a single chip produced on SOI electronics. The MCA spectra and coincidence data obtained therewith are processed with a microprocessor (or other suitable computing device) with output being dose equivalent H in Sv.

Conversion of Solid State Microdosimeter to Dose Equivalent

In regional microdosimetry mode the following steps are used, according to this embodiment, to convert the spectra of deposited energy cluster in silicon to dose equivalent:

Step 1. Acquiring MCA spectra (f(E) versus E) at the output of MCA (at 812 in FIG. 8), as described above.

Step 2. Determining absorbed dose in Si from MCA spectra:

$$\frac{\int_0^\infty f(E)EdE}{M_{Si}},$$

where $M_{Si}$ is a total mass of all 3D SVs of microdosimeter 400.

Step 3. Determining an average SV chord with conversion to tissue equivalent (TE) average chord $<l>_{TE}$:

$$<l>_{TE} = \frac{4V}{S\zeta},$$

where conversion coefficient $\zeta=0.63$, V is the volume of an SV and S is the surface area of an SV.

Step 4. Converting MCA spectra (f(E) versus E) to the lineal energy spectra f(y) vs y where y is equal:

$$y = \frac{E}{<l>_{TE}},$$

Step 5. Determining the fraction of dose deposited in tissue equivalent material by secondaries within lineal energy range y to y+dy:

$$d(y) = \frac{yf(y)}{y_f},$$

where $$y_f = \int_0^\infty yf(y)dy.$$

It is clear that such normalization provides $$\int_0^\infty d(y)dy = 1.$$

Step 6. Converting silicon absorbed dose to TE absorbed dose using Bragg Gray cavity theory:

$$\frac{D_{TE}}{D_{Si}} = \frac{S_{TE}}{S_{Si}},$$

where $S_{TE}/S_{Si}$ is the average ratio of ionizing stopping powers for secondary particles in the radiation field of interest. In most microdosimetric applications for radiation protection (such as in a space environment), the spectra consist of protons and neutrons. It has been demonstrated that the average coefficient is 0.63. However, this coefficient can be adjusted in each case according to application in a known radiation environment, such as a nuclear power plant or an accelerator.

Step 7. Determining dose equivalent in a tissue, in Sv:

$$H = D_{TE} \int_0^\infty Q(y)d(y)dy,$$

where Q(y) is the weighting factor tabulated in Table 1. (Exemplary TE microdosimetric spectra derived from MCA SOI spectra for a background art SOI microdosimeter are plotted as d(y) versus y with a log y scale in FIG. 2.)

Advance Dose Equivalent Determination

In addition to the regional microdosimetry steps presented above, information on track structure can be used in predicting risk of cancer induction.

Exemplary Applications

Below are examples of applications of solid state microdosimeter 400 for radiation protection and neutron dose equivalent measurements in terms of Sv in tissue in proton therapy outside the proton field. Ir first and second experiments, 5 and 10 μm thick SOI microdosimeters (according to the above described embodiment) based on arrays of 4800 of planar parallel p-n junctions with size 30×30×10 μm, covered by a thin layer of polyethylene for mimic of TE material were used. Incomplete charge collection in a planar p-n junction was taken into account with a correction coefficient obtained from studies of charge collection imaging on heavy ions microprobe (see FIGS. 3A, 3B and 3C). The aim of these examples is to demonstrate the feasibility of active solid state microdosimetry for TE measurements.

Example 1

Measurement of TE Microdosimetric Spectra on Pu—Be Gamma-Neutron Source.

The response of an SOI microdosimeter of the background art (cf. FIG. 1) in a mixed gamma/neutron field produced from a 238Pu—Be radioisotope neutron source was measured. The source was located in a general purpose neutron irradiation facility of floor area 7.5 m²; the facility was surrounded by walls 400 mm thick and 1.75 in high of borated paraffin and concrete. The source activity was 325 GBq with an estimated neutron emission rate of 2×10⁷ neutrons in 4π. The average energy of fast neutrons was approximately 4 MeV with a maximum energy of about 10 MeV. The dominant gamma component was a 4.4 MeV emission associated with the decay of the bound excited state of 12C* produced in the Be(α,n) reaction within the 238Pu—Be source. The 5 μm thick SOI microdosimeter with 4800 planar parallel p-n junctions was mounted at a distance of approximately 2.6 cm from the source.

Figure 9:
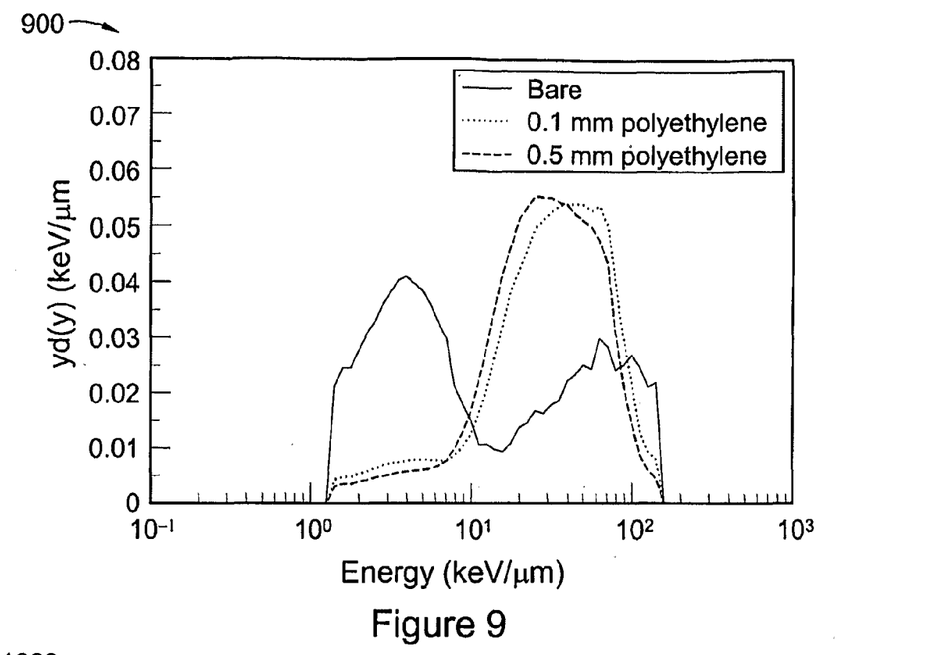
FIG. 9 is an example of a set of plots of TE microdosimetric spectra, derived from experimentally measured MCA spectra obtained from a background art SOI microdosimeter comparable to that of FIG. 1 in response to a mixed gamma/neutron radiation field of a Pu—Be neutron source with and without the presence of a polyethylene converter layer, analysed according to the data processing method of the embodiment of FIG. 4.

FIG. 9 is an example of a set of plots 900 of TE microdosimetric spectra derived from experimentally measured MCA spectra, in response to the mixed gamma/neutron radiation field with and without the presence of a polyethylene converter layer, obtained according to the above Steps 1 to 4 of the data analysis method of this embodiment. The solid line (for the bare SOI microdosimeter) has been scaled up 100 times for ease of comparison and related to event interaction of neutron in Si material. The contribution to simulated dose equivalent is negligible (less then 1%). Microdosimetric spectra match the shape of spectra obtained with TEPC well, supporting the validity of the method of this embodiment.

Example 2

Measurements were made of dose equivalent of neutron contamination in a patient phantom produced during proton therapy.

The interaction of 250 MeV protons with beam modifying devices and the patient produces fast neutrons that are deposit the-energy dose in the patient and may be the cause of secondary cancer. Estimates were made of the equivalent neutron dose within the phantom outside the proton field using solid state microdosimeter and the steps of the data analysis method of the above embodiment.

Figure 10:
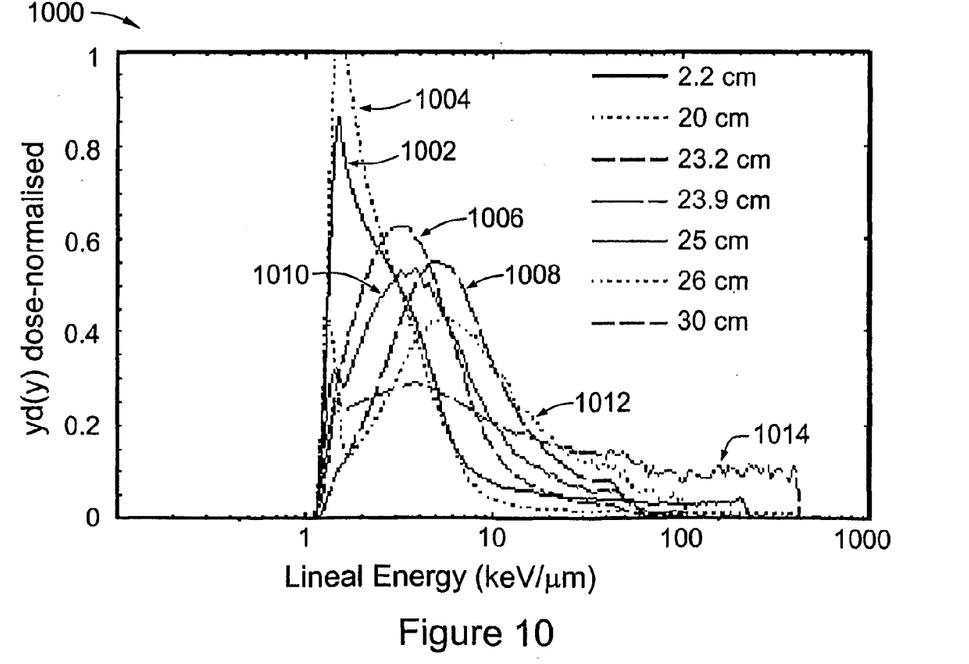
FIG. 10 is a set of plots of TE microdosimetric spectra obtained from MCA spectra with a background art 10 µm SOI microdosimeter comparable to that of FIG. 1 in a water phantom at different depths along the Bragg peak from a 190 MeV proton beam.

FIG. 10 is a set of plots 1000 of TE microdosimetric spectra obtained from the MCA spectra with a background art 10 μm SOI microdosimeter comparable to that of FIG. 1 in a water phantom at different depths in the water phantom along the proton Bragg peak. Proton energy was 190 MeV; the range was 26 cm. For clarity, the individual spectra—according to data collection position—are labelled as follows:

1002 x=2.2 cm
1004: x=20 cm
1006: x=23.2 cm
1008: x=23.9 cm
1010: x=25 cm
1012: x=26 am
1014: x=30 cm

Changes in the shape of the TE normalized microdosimetric spectra with depth to higher LET, due to reducing proton energy, are apparent. The data 1014 collected at x=30 cm (i.e. 4 cm behind the Bragg peak) shows a contribution from neutrons. Good agreement was observed between these microdosimetric spectra and data obtained with TEPC.

FIGS. 11A, 11B, 11C, 11D and 11E illustrate the derivation of the distribution of neutron dose equivalent obtained with a 10 μm background art SOI microdosimeter (cf. FIG. 1), behind a proton field typical for prostate cancer treatment. With the steps of the method of this embodiment described above, neutron dose equivalent was measured 5 cm laterally from the field edge of the proton field along the Spread Out Bragg Peak (SOBP) in an acrylic phantom. Proton energy was 250 MeV.

Figure 11A:
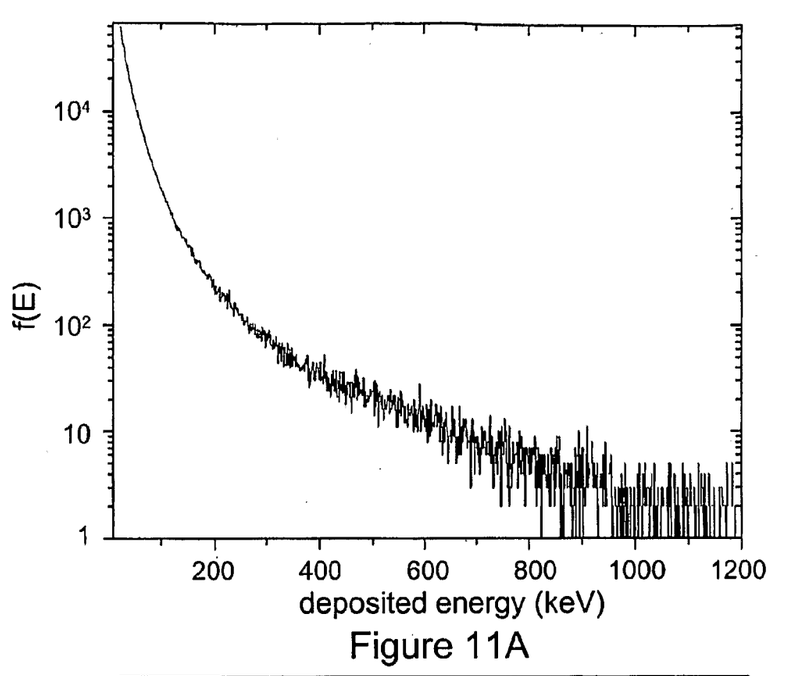
FIGS. 11A, 11B, 11C and 11D are exemplary plots of the derivation of the distribution of neutron dose equivalent obtained with a 10 µm background art SOI microdosimeter comparable to that of FIG. 1 and data processing method of that embodiment, behind a proton field typical for prostate cancer treatment.

The data demonstrate the applicability of this approach for dose equivalent measurements in tissue. The equivalent neutron doses are in a good agreement with that measured with Bonner spheres and TEPC. Another advantage of the SOX microdosimeter is that its spatial resolution is superior to other methods that allow measurements to be made in any point in a phantom Thus, FIG. 11A is a plot of MCA spectra f(E) versus deposited energy (keV), obtained with a background art SOI microdosimeter comparable to that of FIG. 1 (cf. Step 1). In Step 2, the areas under the MCA spectra and total mass of Si sensitive volumes are used to obtain the absorbed dose in Si. Absorbed dose in Si is converted to TE dose. Ratio of stopping powers used was 0.63.

Figure 11B:
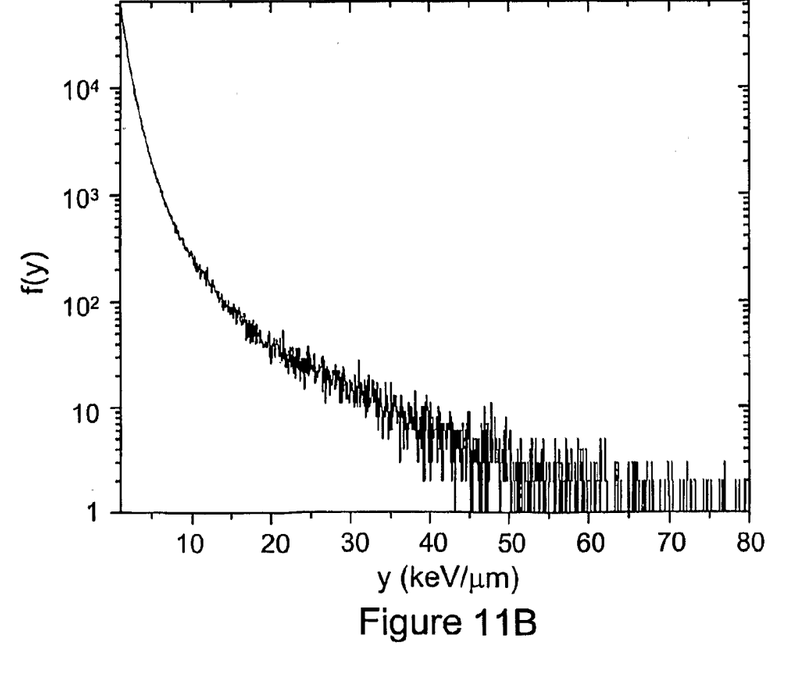

Steps 3 and 4 comprise the conversion of the MCA spectra (f(E) versus energy) to the lineal energy spectra f(y) versus y; the result is plotted in FIG. 11B.

Figure 11C:
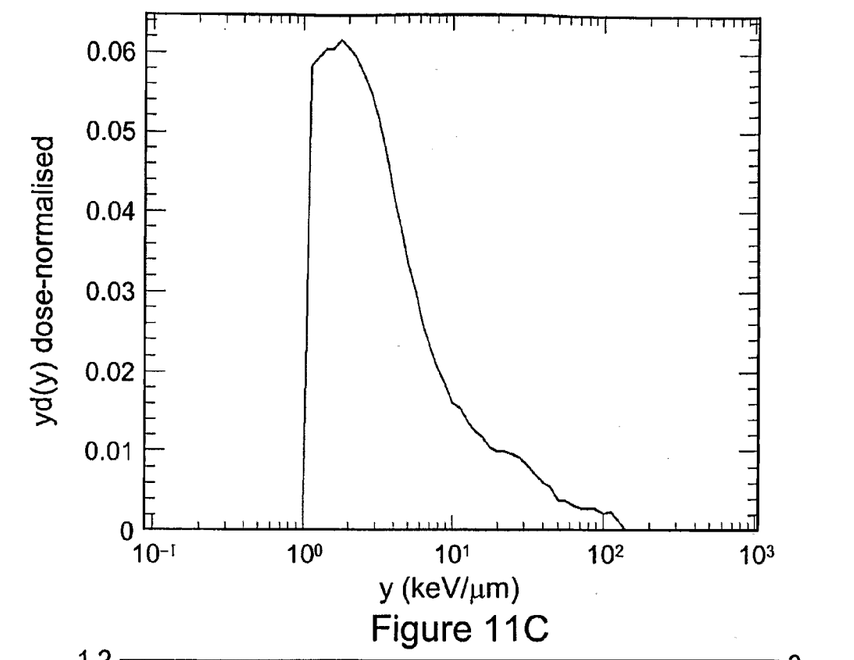

In Step 5, normalized microdosimetry spectra are obtained, as shown in FIG. 11C (in which, as a result, the area under the curve is 1).

Steps 6 and 7 produce a simulation of dose equivalent by convolution of spectra on FIG. 11C and Q(y) of Table 1.

Figure 11D:
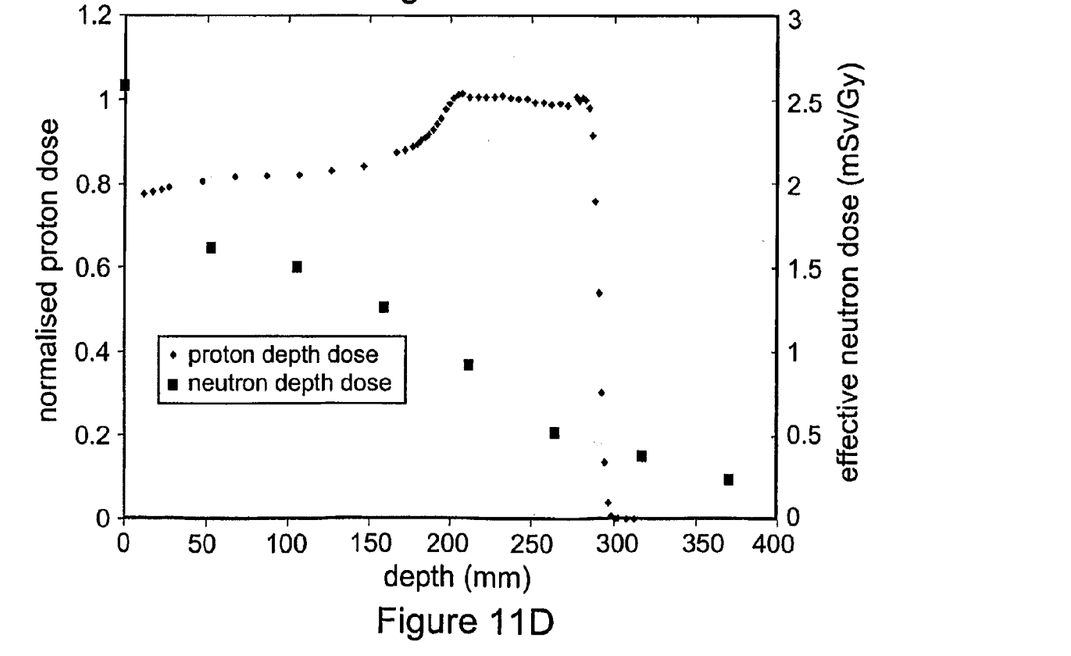

FIG. 11D a plot of the derived distribution of neutron dose equivalent, expressed in mSv (millisiverts) per 1 Gy of proton absorbed dose. For clarity the proton dose distribution is also shown.

Figure 12:
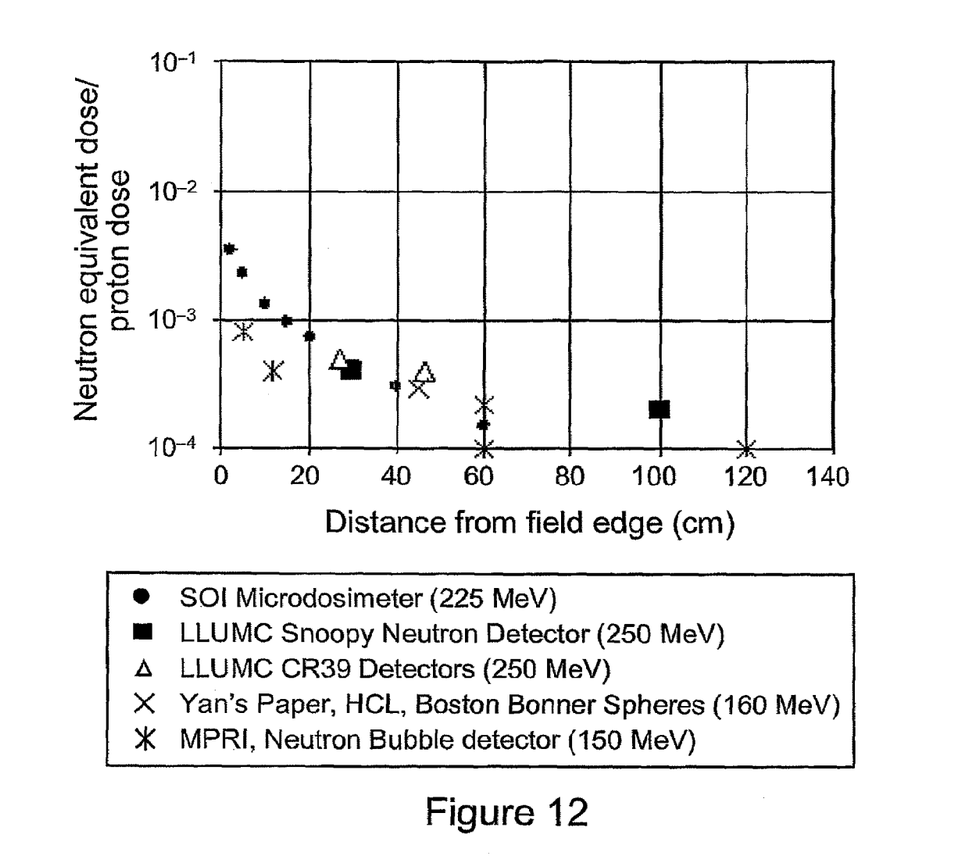
FIG. 12 is a comparative plot of neutron dose equivalent measured in similar conditions from a background art microdosimeter comparable to that of FIG. 1 analysed according to the data processing method of the embodiment of FIG. 4, and with other proton therapy facilities using TE detectors and Bonner Spheres.

FIG. 12 is a comparison of neutron dose equivalent dose equivalent of neutrons in a particular location outside the treatment volume per 1 Gy absorbed dose of protons delivered to the target, measured in similar conditions from other proton therapy facilities using TE detectors and Bonner Spheres. The plotted data show good agreement with dose equivalent measured with SOI microdosimeter of this embodiment processed with Steps 1 to 7 (above).

These examples demonstrate firstly the utility of SOI microdosimeters with arrays of three-dimensional p-n junctions according to this invention, and data processing according to the seven step method described above according to this invention for quantitative characterization of mixed radiation fields n terms of tissue, rather than separation of gamma from neutron radiation in terms of counts as performed by others using arrays of planar p-n junctions for microdosimetry.

The SOI microdosimeter with 3D avalanche SVs according to this embodiment thus appears to improve dynamic range and accuracy owing to the avoidance of pile up artefacts in microdosimetric spectra and the ability to analyse the track structure of high energy ions. This microdosimeter is free of at least some of the shortcomings of existing silicon microdosimeters but takes advantage of the best features of gas TEPCs, and hence can measure LET to less than 1 keV/μm.

In the preceding description of the invention, except where the context requires otherwise owing to express language or necessary implication, the word "comprise" or variations such as "comprises" or "comprising" is used in an inclusive sense, that is, to specify the presence of the stated features but not to preclude the presence or addition of further features in various embodiments of the invention.

Further, any reference herein to prior art is not intended to imply that such prior art forms or formed a part of the common general knowledge in Australia or any other country.

The invention claimed is:

1. A microdosimeter, comprising:
an array of mutually spatially separated, three-dimensional p-n junction semiconductor detectors, each providing a micron- or submicron-scale sensitive volume-target; and
a tissue equivalent medium for generating secondary charged particles, respective portions of said tissue equivalent medium being located between said detectors;
wherein said array is manufactured from a semiconductor on insulator wafer, said detectors are located to detect secondary charged particles generated in said tissue equivalent medium, and each of said detectors is electrically connected to a plurality of other detectors of said detectors.

2. A microdosimeter as claimed in claim 1, wherein said semiconductor detectors are silicon detectors.

3. A microdosimeter as claimed in claim 1, wherein said detectors are cylindrical or near-cylindrical.

4. A microdosimeter as claimed in claim 1, wherein each of said detectors has a core comprising a p+electrode, and an outer n+electrode region.

5. A microdosimeter as claimed in claim 1, wherein each of said detectors has a core comprising a rod-like p+region within a Si sensitive volume.

6. A microdosimeter as claimed in claim 5, wherein said core has a small radial size.

7. A microdosimeter as claimed in claim 6, wherein said core has a diameter of from 1 μm to 5 μm.

8. A microdosimeter as claimed in claim 6, wherein amplification of deposited charge is controllable with p-n junction bias.

9. A microdosimeter as claimed in claim 1, wherein said tissue equivalent medium comprises polymethylmethacrylate.

10. A microdosimeter as claimed in claim 1, wherein said detectors are electrically connected such that each of said detectors is not connected to at least one of its immediately neighboring detectors of said detectors.

11. A microdosimeter as claimed in claim 1, comprising a multi-channel analyser for acquiring at least one spectrum of data from said detectors, and computational means for determining absorbed dose in Si from said spectrum, converting said spectrum to a lineal energy spectrum, determining from said lineal energy spectrum a differential dose d(y) deposited in tissue equivalent material by secondary events within a lineal energy range y to y+dy, converting semiconductor absorbed dose to tissue equivalent absorbed dose using respective semiconductor and tissue equivalent ionizing stopping powers for secondary particles, and determining dose equivalent in a tissue from said tissue equivalent absorbed dose, comprising convoluting said differential dose with a lineal energy dependent quality coefficient.

12. A method for processing microdosimeter data, comprising:
   acquiring at least one spectrum with a microdosimeter as claimed in claim 1;
   determining absorbed dose in Si from said spectrum;
   converting said spectrum to a lineal energy spectrum;
   determining from said lineal energy spectrum a differential dose d(y) deposited in tissue equivalent material by secondary events within a lineal energy range y to y+dy;
   converting semiconductor absorbed dose to tissue equivalent absorbed dose using respective semiconductor and tissue equivalent ionizing stopping powers for secondary particles; and
   determining dose equivalent in a tissue from said tissue equivalent absorbed dose, comprising convoluting said differential dose with a lineal energy dependent quality coefficient.

13. A method as claimed in claim 12, comprising converting said spectrum to a lineal energy spectrum with a tissue equivalent average chord.

14. A microdosimeter as claimed in claim 1, wherein said detectors are covered with said tissue equivalent medium.

15. A microdosimeter as claimed in claim 1, wherein said detectors are frusto-conical.

16. A method for performing microdosimetry, comprising:
   exposing a tissue equivalent medium to a radiation source, thereby generating secondary charged particles in said tissue equivalent medium; and
   detecting at least some of said secondary charged particles with an array of mutually spatially separated, three-dimensional p-n junction semiconductor detectors, each providing a micron- or submicron-scale sensitive volume-target, said array manufactured from a semiconductor on insulator wafer
   wherein respective portions of said tissue equivalent medium are located between said detectors and each of said detectors is electrically connected to a plurality of other detectors of said detectors.

17. A method as claimed in claim 16, comprising electrically connecting said detectors such that each of said detectors is not connected to at least one of its immediately neighboring detectors of said detectors.

* * * * *